United States Patent
Bang et al.

(10) Patent No.: US 11,648,747 B2
(45) Date of Patent: May 16, 2023

(54) PLATE INCLUDING FINE PATTERN, AND ELECTRONIC DEVICE INCLUDING SAME

(71) Applicant: Samsung Electronics Co., Ltd., Suwon-si (KR)

(72) Inventors: Hyejin Bang, Suwon-si (KR); Jeonga Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 17/278,188

(22) PCT Filed: May 29, 2019

(86) PCT No.: PCT/KR2019/006410
§ 371 (c)(1),
(2) Date: Mar. 19, 2021

(87) PCT Pub. No.: WO2020/060001
PCT Pub. Date: Mar. 26, 2020

(65) Prior Publication Data
US 2021/0347145 A1    Nov. 11, 2021

(30) Foreign Application Priority Data
Sep. 21, 2018  (KR) .......................... 10-2018-0114062

(51) Int. Cl.
*B32B 3/30*   (2006.01)
*B32B 3/08*   (2006.01)
(Continued)

(52) U.S. Cl.
CPC .................. *B32B 3/30* (2013.01); *B32B 3/08* (2013.01); *B32B 3/26* (2013.01); *B32B 17/10* (2013.01);
(Continued)

(58) Field of Classification Search
CPC . B32B 3/30; B32B 2255/205; B32B 2307/40; B32B 3/08; B32B 33/00;
(Continued)

(56) References Cited

U.S. PATENT DOCUMENTS 10,133,309 B2   11/2018  Chang
10,203,724 B2   2/2019   Yoon et al.
(Continued)

FOREIGN PATENT DOCUMENTS

JP   2007-207893 A     8/2007
KR   10-2008-0070424 A  7/2008
(Continued)

OTHER PUBLICATIONS

International Search Report dated Sep. 20, 2019 in connection with International Patent Application No. PCT/KR2019/006410, 2 pages.

*Primary Examiner* — Jasper Saberi

(57) ABSTRACT

Disclosed is an electronic device that includes a first plate that forms a first surface of the electronic device through which contents are output, a second plate that forms a second surface facing away from the first surface, and a side member that surrounds a space between the first plate and the second plate. The second plate includes a UV curable resin layer including a fine pattern that implements an interference effect and a prism effect of light and a metal nanoparticle layer printed on the fine pattern so as to have a specific orientation. Besides, it may be permissible to prepare various other embodiments speculated through the specification.

10 Claims, 11 Drawing Sheets

(51) Int. Cl.
    *B32B 17/10*     (2006.01)
    *B32B 27/08*     (2006.01)
    *B32B 37/24*     (2006.01)
    *B32B 38/00*     (2006.01)
    *H05K 5/02*     (2006.01)
    *B32B 3/26*     (2006.01)
    *B32B 33/00*     (2006.01)
    *H05K 5/00*     (2006.01)
    *H04M 1/02*     (2006.01)

(52) U.S. Cl.
    CPC .............. *B32B 27/08* (2013.01); *B32B 33/00* (2013.01); *B32B 37/24* (2013.01); *B32B 38/145* (2013.01); *H04M 1/0266* (2013.01); *H05K 5/0086* (2013.01); *H05K 5/0217* (2013.01); *H05K 5/0243* (2013.01); *B32B 2037/243* (2013.01); *B32B 2255/10* (2013.01); *B32B 2255/205* (2013.01); *B32B 2255/26* (2013.01); *B32B 2255/28* (2013.01); *B32B 2307/40* (2013.01); *B32B 2307/402* (2013.01); *B32B 2307/412* (2013.01); *B32B 2457/208* (2013.01); *H04M 1/0283* (2013.01)

(58) Field of Classification Search
    CPC ... B32B 37/24; H04M 1/0266; H04M 1/0283; H05K 5/0086; H05K 5/0217; H05K 5/0243
    See application file for complete search history.

(56) References Cited

U.S. PATENT DOCUMENTS

| | | | |
|---|---|---|---|
| 10,700,415 | B2 | 6/2020 | Shin et al. |
| 2011/0291315 | A1* | 12/2011 | Roberts .................. B05D 1/005 |
| | | | 264/108 |
| 2015/0309245 | A1 | 10/2015 | Jeon et al. |
| 2016/0097893 | A1 | 4/2016 | Sohn et al. |
| 2017/0250460 | A1* | 8/2017 | Shin ....................... H01Q 21/28 |
| 2019/0275777 | A1* | 9/2019 | Aridomi ................. B32B 23/08 |
| 2020/0288592 | A1* | 9/2020 | Gao ..................... B32B 27/308 |
| 2021/0029234 | A1* | 1/2021 | Gao ....................... B32B 3/263 |

FOREIGN PATENT DOCUMENTS

| | | |
|---|---|---|
| KR | 10-2009-0078773 A | 7/2009 |
| KR | 10-2014-0141116 A | 12/2014 |
| KR | 10-2015-0122341 A | 11/2015 |
| KR | 10-2016-0041235 A | 4/2016 |
| KR | 10-2016-0136929 A | 11/2016 |
| KR | 10-2017-0100972 A | 9/2017 |
| WO | WO-2019214389 A1 * | 11/2019 ............. B32B 27/06 |

\* cited by examiner

PLATE INCLUDING FINE PATTERN, AND ELECTRONIC DEVICE INCLUDING SAME

CROSS-REFERENCE TO RELATED APPLICATIONS

This application is a 371 of International Application No. PCT/KR2019/006410 filed on May 29, 2019, which claims priority to Korean Patent Application No. 10-2018-0114062 filed on Sep. 21, 2018, the disclosures of which are herein incorporated by reference in their entirety.

BACKGROUND

1. Field

Embodiments of the disclosure described herein relate to a technology for forming a plate constituting the exterior of an electronic device.

2. Description of Related Art

Electronic devices, particularly, mobile devices such as smartphones are being rapidly developed. In the mobile devices, portability is one of very important features, and efforts for compactness, light weight, slimness, and the like are being continually made. Functions of smartphones are being unimaginably diversified beyond functions unique to mobile phones. According to the trend toward the diversification of functions, IT technologies integrated in the smartphones themselves are complex, and the product prices of the smartphones are high.

Meanwhile, in electronic devices using glass substrates, there has been increasing interest in effects such as forming a variety of aesthetic appearances that can be implemented through the glass substrates, and technologies related to decorative films (or, deco films) for glass substrates have been actively developed.

A plate in the related art is formed by directly printing silver ink on a polymer compound substrate to form a polymer compound film and attaching the formed polymer compound film to a glass substrate. Accordingly, a particle texturing feel of the silver ink largely appears on the plate, and therefore the luminance of the plate is decreased, and a sense of depth is not felt from the plate.

Various embodiments are aimed at providing a plate having a luxurious appearance by separately stacking a primer layer for implementing a color of the plate, an ultraviolet (UV) curable resin layer for implementing a sense of depth, and a metal nanoparticle layer for raising luminance.

Various embodiments are aimed at providing a plate showing the same effect as that of deposition by using a printing method.

SUMMARY

An electronic device according to an embodiment of the disclosure includes a first plate that forms a first surface of the electronic device through which contents are output, a second plate that forms a second surface facing away from the first surface, and a side member that surrounds a space between the first plate and the second plate. The second plate includes a UV curable resin layer including a fine pattern that implements an interference effect and a prism effect of light and a metal nanoparticle layer printed on the fine pattern so as to have a specific orientation.

A plate for forming one surface of an electronic device according to an embodiment of the disclosure includes a glass substrate, a polymer compound substrate attached to the glass substrate through an adhesive layer, a primer layer that is printed on the polymer compound substrate and that implements a color of the plate, a UV curable resin layer that is printed on the primer layer and that includes a fine pattern that implements an interference effect and a prism effect of light, and a metal nanoparticle layer printed on the UV curable resin layer so as to have a specific orientation.

A manufacturing method of a plate for forming one surface of an electronic device according to an embodiment of the disclosure includes an operation of printing, on a polymer compound substrate, a primer layer that implements a color of the plate, an operation of coating UV molding on the primer layer, an operation of forming a UV curable resin layer by transferring a fine pattern to the UV molding through a mold and applying UV rays to the UV molding, and an operation of printing a silver paste containing metal nanoparticles on the UV curable resin layer through a silk screen method such that the metal nanoparticles have a specific orientation.

According to the embodiments of the disclosure, the plate having a luxurious appearance may be provided by separately stacking the primer layer for implementing the color of the plate, the ultraviolet (UV) curable resin layer for implementing a sense of depth, and the metal nanoparticle layer for raising luminance.

According to the embodiments of the disclosure, the plate showing the same effect as that of deposition may be provided by using the printing method.

In addition, the disclosure may provide various effects that are directly or indirectly recognized.

BRIEF DESCRIPTION OF THE DRAWINGS

With regard to description of the drawings, identical or similar reference numerals may be used to refer to identical or similar components.

DETAILED DESCRIPTION

Hereinafter, various embodiments of the disclosure will be described with reference to accompanying drawings.

However, this is not intended to limit the disclosure to specific embodiments, and it should be understood that the disclosure includes various modifications, equivalents, and/or alternatives of the embodiments of the disclosure.

Figure 1:
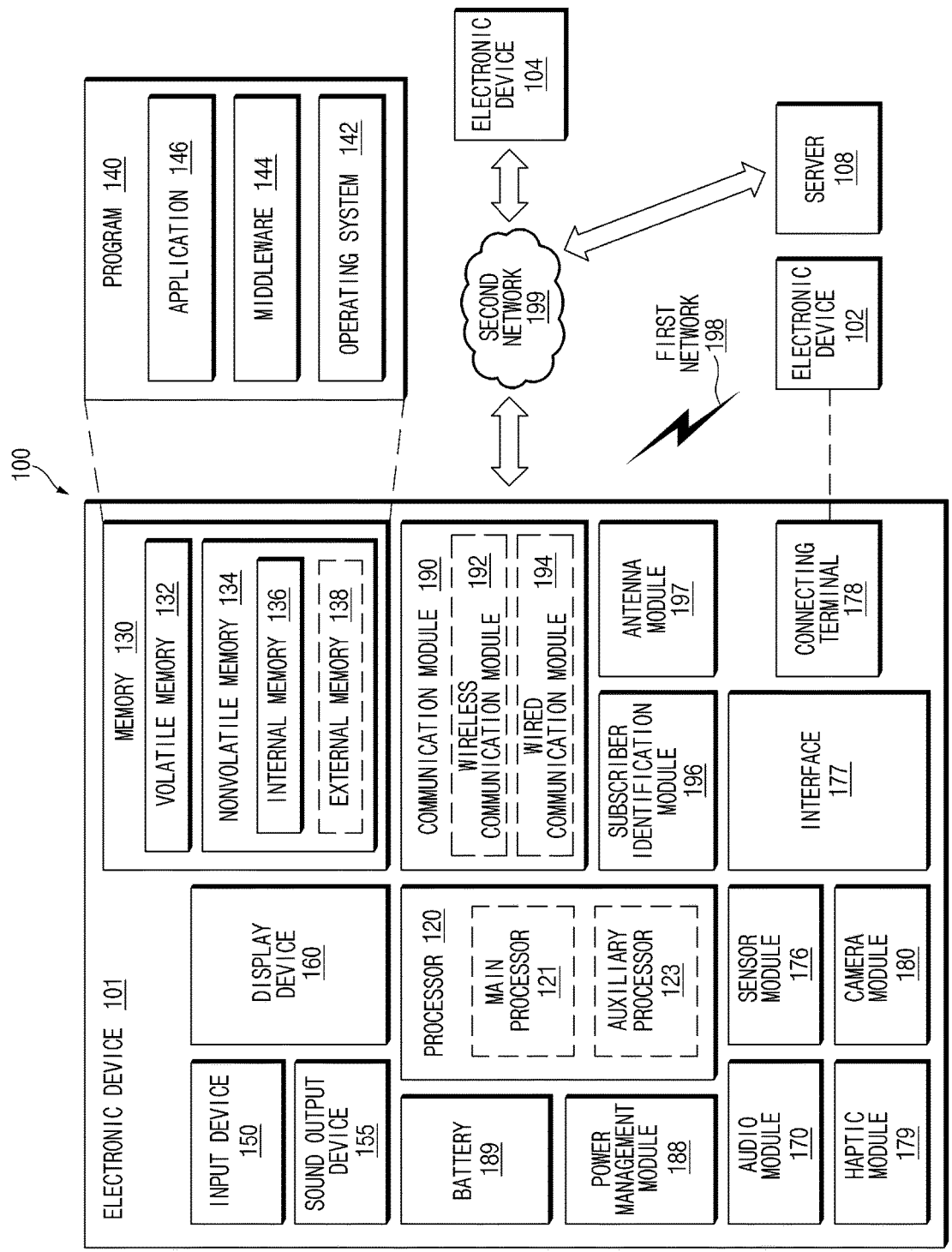
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
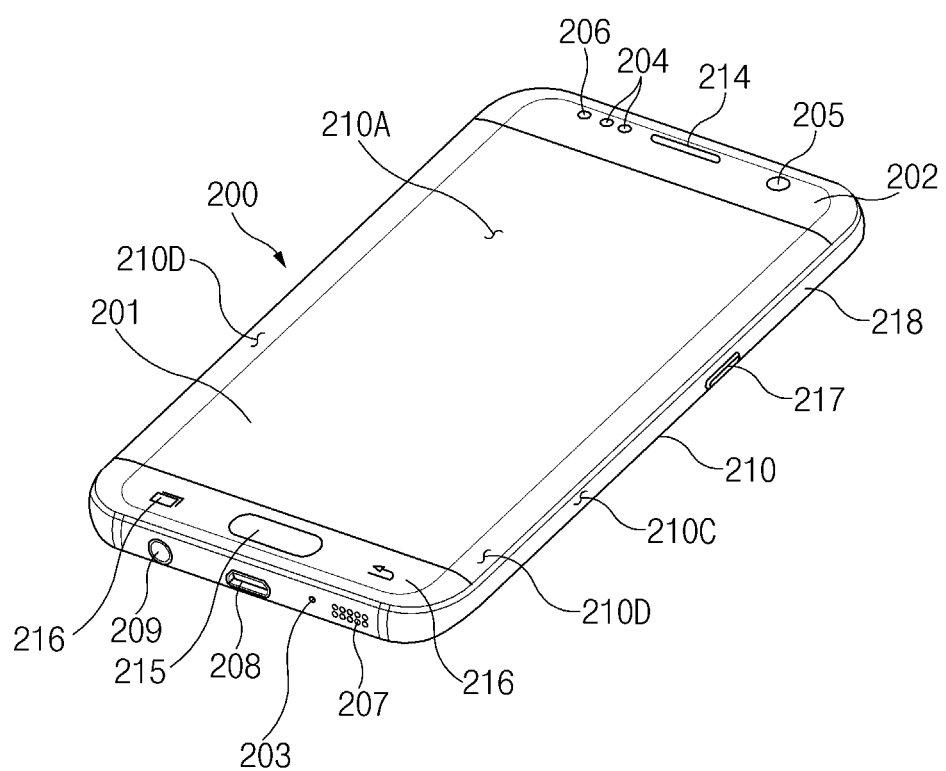
FIG. 2A is a front perspective view of a mobile electronic device according to an embodiment.
Figure 2B:
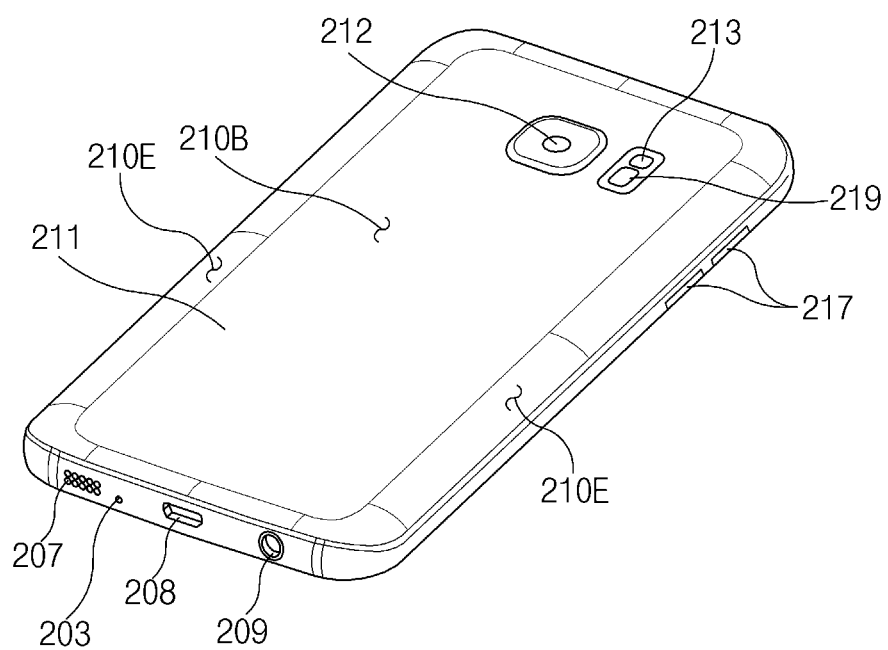
FIG. 2B is a rear perspective view of the electronic device of FIG. 2A.

FIG. 2A is a front perspective view of a mobile electronic device according to an embodiment. FIG. 2B is a rear perspective view of the electronic device of FIG. 2A.

Referring to FIGS. 2A and 2B, the electronic device 200 according to the embodiment may include a housing 210 that includes a first surface (or, a front surface) 210A, a second surface (or, a rear surface) 210B, and side surfaces 210C surrounding a space between the first surface 210A and the second surface 210B. In another embodiment (not illustrated), a housing may refer to a structure that forms some of the first surface 210A, the second surface 210B, and the side surfaces 210C of FIG. 2A. According to an embodiment, the first surface 210A may be formed by a front plate 202 (e.g., a glass plate including various coating layers, or a polymer plate), at least part of which is substantially transparent. The second surface 210B may be formed by a back plate 211 that is substantially opaque. The back plate 211 may be formed of, for example, coated or colored glass, ceramic, polymer, metal (e.g., aluminum, stainless steel (STS), or magnesium), or a combination of at least two of the aforementioned materials. The side surfaces 210C may be formed by a side bezel structure (or, a "side member") 218 that is coupled with the front plate 202 and the back plate 211 and that contains metal and/or polymer. In some embodiments, the back plate 211 and the side bezel structure 218 may be integrally formed with each other and may contain the same material (e.g., a metallic material such as aluminum).

In the illustrated embodiment, the front plate 202 may include, at opposite long edges of the front plate 202, two first areas 210D that curvedly and seamlessly extend from the first surface 210A toward the back plate 211. In the illustrated embodiment (refer to FIG. 2B), the back plate 211 may include, at opposite long edges thereof, two second areas 210E that curvedly and seamlessly extend from the second surface 210B toward the front plate 202. In some embodiments, the front plate 202 (or, the back plate 211) may include only one of the first areas 210D (or, the second areas 210E). In another embodiment, a part of the first areas 210D or the second areas 210E may not be included. In the embodiments, when viewed from a side of the electronic device 200, the side bezel structure 218 may have a first thickness (or, width) at sides not including the first areas 210D or the second areas 210E and may have a second thickness smaller than the first thickness at sides including the first areas 210D or the second areas 210E.

According to an embodiment, the electronic device 200 may include at least one of a display 201, audio modules 203, 207, and 214, sensor modules 204 and 219, camera modules 205, 212, and 213, key input devices 215, 216, and 217, an indicator 206, and connector holes 208 and 209. In some embodiments, the electronic device 200 may omit at least one component (e.g., the key input devices 215, 216, and 217 or the indicator 206) among the aforementioned components, or may additionally include other component(s).

The display 201, for example, may be exposed through most of the front plate 202. In some embodiments, at least part of the display 201 may be exposed through the front plate 202 that forms the first surface 210A and the first areas 210D of the side surfaces 210C. The display 201 may be combined with, or disposed adjacent to, touch detection circuitry, a pressure sensor capable of measuring the intensity (pressure) of a touch, and/or a digitizer for detecting a stylus pen of a magnetic field type. In some embodiments, at least a part of the sensor modules 204 and 219 and/or at least a part of the key input devices 215, 216, and 217 may be disposed in the first areas 210D and/or the second areas 210E.

The audio modules 203, 207, and 214 may include the microphone hole 203 and the speaker holes 207 and 214. A microphone for obtaining a sound from the outside may be disposed in the microphone hole 203, and in some embodiments, a plurality of microphones may be disposed in the microphone hole 205 to detect the direction of a sound. The speaker holes 207 and 214 may include the external speaker hole 207 and the receiver hole 214 for a telephone call. In some embodiments, the speaker holes 207 and 214 and the microphone hole 203 may be implemented with a single hole, or without the speaker holes 207 and 214, a speaker may be included (e.g., a piezo speaker).

The sensor modules 204 and 219 may generate an electrical signal or a data value that corresponds to an operational state inside the electronic device 200 or an environmental state external to the electronic device 200. The sensor modules 204 and 219 may include, for example, the first sensor module 204 (e.g., a proximity sensor) and/or the second sensor module (not illustrated) (e.g., a fingerprint sensor) that is disposed on the first surface 210A of the housing 210, and/or the third sensor module 219 (e.g., an HRM sensor) that is disposed on the second surface 210B of the housing 210. The fingerprint sensor may be disposed not only on the first surface 210A (e.g., the home key button 215) of the housing 210 but also on the second surface 210B. The electronic device 200 may further include a non-illustrated sensor module, for example, at least one of a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor 204.

The camera modules 205, 212, and 213 may include the first camera device 205 disposed on the first surface 210A of the electronic device 200, and the second camera device 212 and/or the flash 213 disposed on the second surface 210B. The camera devices 205 and 212 may include one or more lenses, an image sensor, and/or an image signal processor. The flash 213 may include, for example, a light emitting diode or a xenon lamp. In some embodiments, two or more lenses (an IR camera lens, a wide angle lens, and a telephoto lens) and image sensors may be disposed on one surface of the electronic device 200.

The key input devices 215, 216, and 217 may include the home key button 215 disposed on the first surface 210A of the housing 210, the touch pad 216 disposed around the home key button 215, and/or the side key buttons 217 disposed on the side surfaces 210C of the housing 210. In another embodiment, the electronic device 200 may not include all or some of the aforementioned key input devices 215, 216, and 217, and the key input devices 215, 216, and 217 not included may be implemented in a different form, such as a soft key, on the display 201.

The indicator 206, for example, may be disposed on the first surface 210A of the housing 210. The indicator 206, for example, may provide state information of the electronic device 100 in the form of light and may include an LED.

The connector holes 208 and 209 may include the first connector hole 208 capable of accommodating a connector (e.g., a USB connector) for transmitting and receiving electric power and/or data with an external electronic device, and/or the second connector hole (e.g., an earphone jack) 209 capable of accommodating a connector for transmitting and receiving audio signals with an external electronic device.

Figure 3:
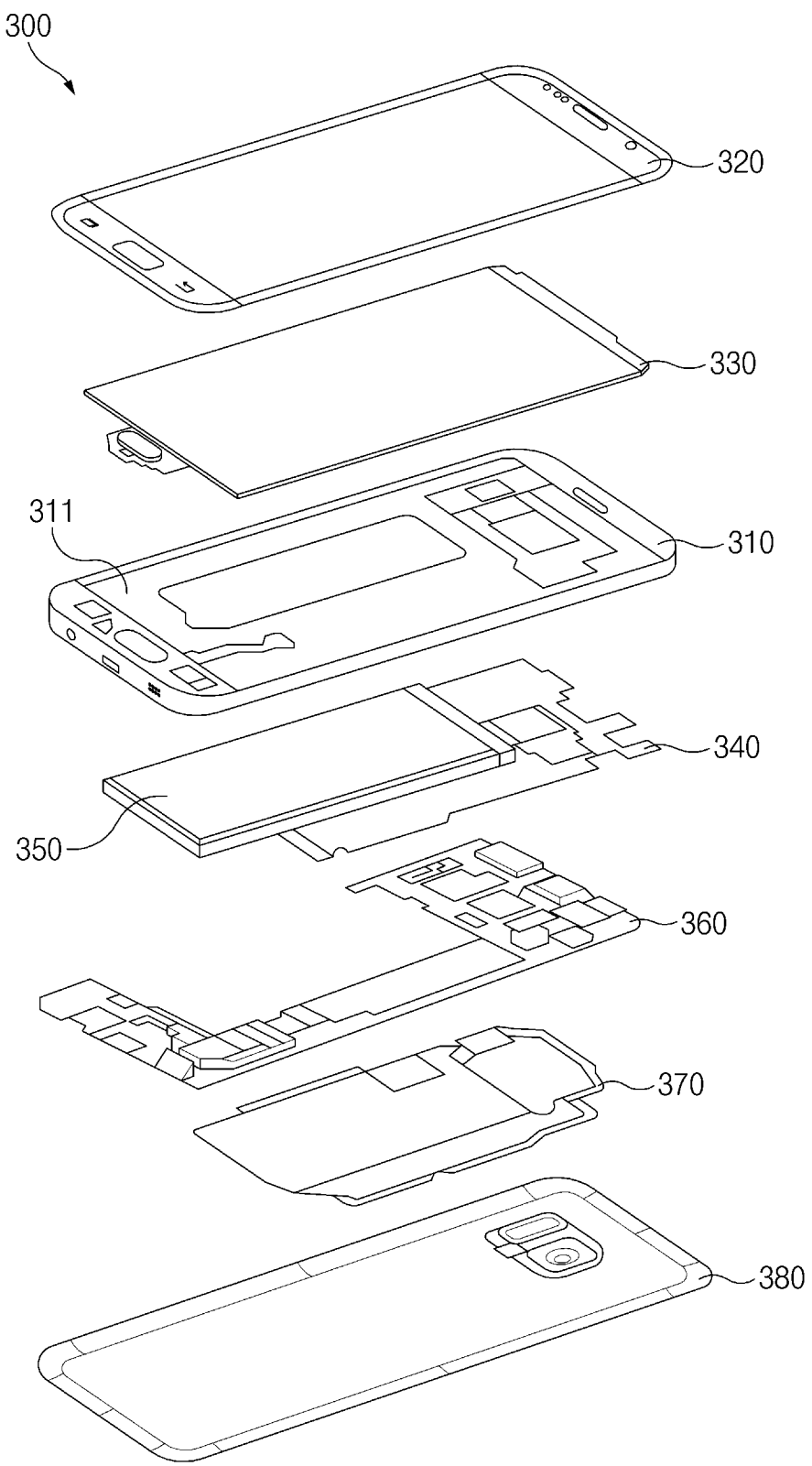
FIG. 3 is an exploded perspective view of the electronic device of FIGS. 2A and 2B.

FIG. 3 is an exploded perspective view of the electronic device of FIGS. 2A and 2B.

Referring to FIG. 3, the electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a back plate 380. In some embodiments, the electronic device 300 may omit at least one component (e.g., the first support member 311 or the second support member 360) among the aforementioned components, or may additionally include other component(s). At least one of the components of the electronic device 300 may be the same as, or similar to, at least one of the components of the electronic device 200 of FIG. 2A or 2B, and repetitive descriptions will hereinafter be omitted.

The first support member 311 may be disposed inside the electronic device 300 and may be connected with the side bezel structure 310, or may be integrally formed with the side bezel structure 310. The first support member 311 may be formed of, for example, a metallic material and/or a nonmetallic (e.g., polymer) material. The display 330 may be coupled to one surface of the first support member 311, and the printed circuit board 340 may be coupled to an opposite surface of the first support member 311. A processor, a memory, and/or an interface may be mounted on the printed circuit board 340. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 300 with an external electronic device and may include a USB connector, an SD card/MMC connector, or an audio connector.

The battery 350, which is a device for supplying electric power to at least one component of the electronic device 300, may include, for example, a primary cell that is not rechargeable, a secondary cell that is rechargeable, or a fuel cell. At least part of the battery 350, for example, may be disposed on substantially the same plane as the printed circuit board 340. The battery 350 may be integrally disposed inside the electronic device 300, or may be disposed so as to be detachable from the electronic device 300.

The antenna 370 may be disposed between the back plate 380 and the battery 350. The antenna 370 may include, for example, a near field communication (NFC) antenna, a wireless charging antenna, and/or a magnetic secure transmission (MST) antenna. The antenna 370, for example, may perform short-range communication with an external device, or may wirelessly transmit and receive electric power required for charging. In another embodiment, an antenna structure may be formed by part of the side bezel structure 310 and/or part of the first support member 311, or a combination thereof.

Figure 4A:
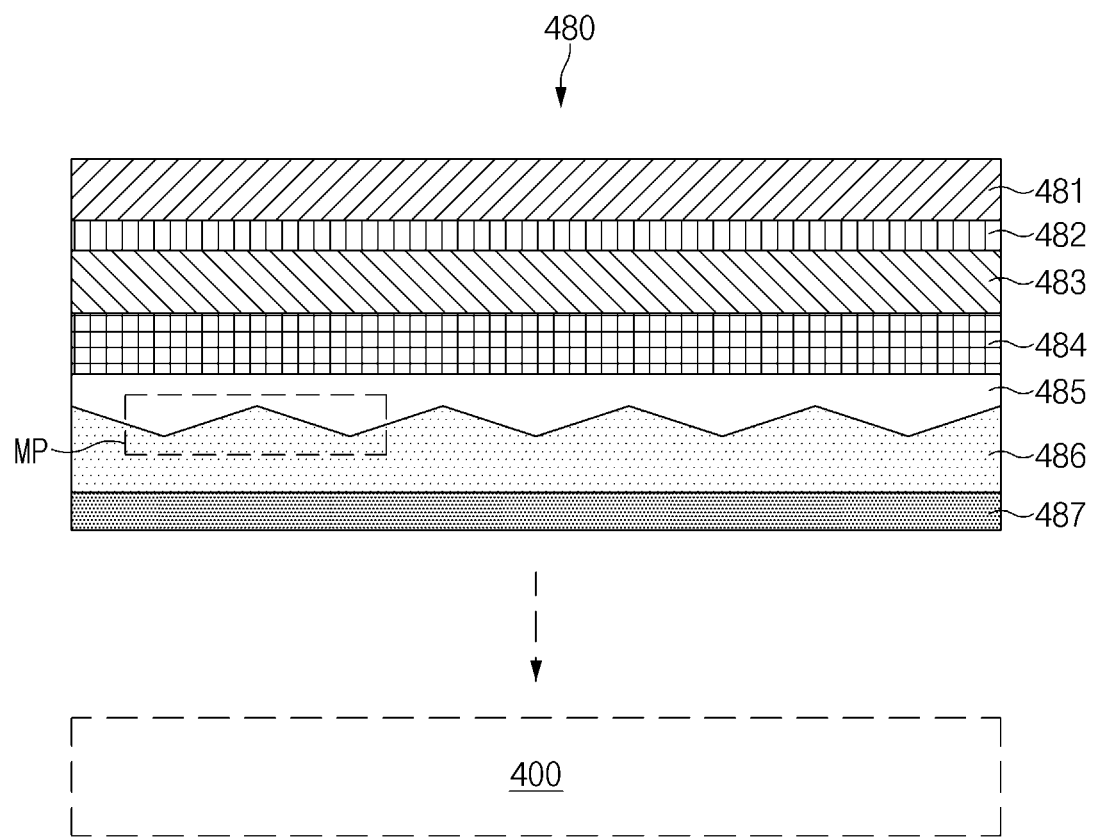
FIG. 4A is a sectional view illustrating a configuration of a back plate of an electronic device according to an embodiment.

FIG. 4A is a sectional view illustrating a configuration of a back plate of an electronic device according to an embodiment.

Referring to FIG. 4A, the back plate 480 (e.g., the back plate 380) of the electronic device 400 (e.g., the electronic device 300) may be formed by stacking a plurality of layers. For example, the back plate 480 may include a glass substrate 481, an adhesive layer 482, a polymer compound substrate 483, a primer layer 484, a UV curable resin layer 485, a metal nanoparticle layer 486, and a printed shielding layer 487.

According to an embodiment, the glass substrate 481 may determine the shape of the back plate 480. The glass substrate 481 may be formed in a shape that is able to be coupled to a rear surface of the electronic device 400. The polymer compound substrate 483 may be attached to the glass substrate 481 by the adhesive layer 482. For example, the adhesive layer 482 may include an optical clear adhesive (OCA). The polymer compound substrate 483 may include polyethylene terephthalate (PET).

According to an embodiment, the primer layer 484, the UV curable resin layer 485, the metal nanoparticle layer 486, and the printed shielding layer 487 may be stacked on the polymer compound substrate 483 to form a polymer compound film. The formed polymer compound film may be attached to the glass substrate 481 by the adhesive layer 482.

According to an embodiment, the primer layer 484 may be printed on one side of the polymer compound substrate 483. For example, the primer layer 484 may have a translucent chromatic color. The primer layer 484 may implement various colors, as compared with when formed by a deposition method. The primer layer 484 may implement an effect such as a particle texturing feel, by applying a pigment.

According to an embodiment, the UV curable resin layer 485 may be formed on one side of the primer layer 484. For example, the UV curable resin layer 485 may include a fine pattern MP. The fine pattern MP may implement a sense of depth on the back plate 480 through an interference effect and a prism effect. The back plate 480 may compensate for visual shortcomings (e.g., smoothness, scratch, or wear) through the interference effect by the fine pattern MP. The fine pattern MP may be implemented in various forms including ridges and valleys.

According to an embodiment, the UV curable resin layer 485 may be formed through a pattern transfer process using a mold. For example, UV molding may be coated on the one side of the primer layer 484. The UV molding may be compressed by a mold having a shape corresponding to the fine pattern MP, and the fine pattern MP may be formed on the UV molding. When UV rays are applied to the UV molding, the UV molding may be cured in the state in which the fine pattern MP is formed thereon.

According to an embodiment, the metal nanoparticle layer 486 may be printed on the side of the UV curable resin layer 485 on which the fine pattern MP is formed. For example, the metal nanoparticle layer 486 may be formed by printing a silver paste containing metal nanoparticles NS. The metal nanoparticle layer 486 may be formed through a silk screen method. The metal nanoparticle layer 486 may be formed by performing the silk screen method several times in the same direction. The metal nanoparticles NS may be printed on the UV curable resin layer 485 through the silk screen method so as to have a specific orientation. The metal nanoparticles NS may be accumulated in the valleys of the fine pattern MP so as to have the specific orientation. Due to this, a combination of the metal nanoparticle layer 486 and the UV curable resin layer 485 may implement the same luminance as deposition. Furthermore, the metal nanoparticles NS do not have electromagnetic wave characteristics and do not affect communication of the electronic device 400.

According to an embodiment, the printed shielding layer 487 may be formed on one side of the metal nanoparticle layer 486. For example, the printed shielding layer 487 may be implemented in a dark color and may prevent external light from infiltrating into the electronic device 400. The printed shielding layer 487 may serve to protect the primer layer 484, the UV curable resin layer 485, and the metal nanoparticle layer 486. According to various embodiments, the printed shielding layer 487 may be omitted.

As described above, according to various embodiments, the primer layer 484, the UV curable resin layer 485, and the metal nanoparticle layer 486 may be separately stacked on the back plate 480. The primer layer 484 may implement various colors. The UV curable resin layer 485 may include the fine pattern MP and may improve the sense of depth of the back plate 480. The combination of the UV curable resin layer 485 and the metal nanoparticle layer 486 may improve the luminance of the back plate 480. The primer layer 484, the UV curable resin layer 485, and the metal nanoparticle layer 486 may be formed by a printing method rather than a deposition method. Accordingly, the back plate 480 may be manufactured by the printing method and may implement the same effects (e.g., various colors, a sense of depth, and high luminance) as those of the deposition method.

Figure 4B:
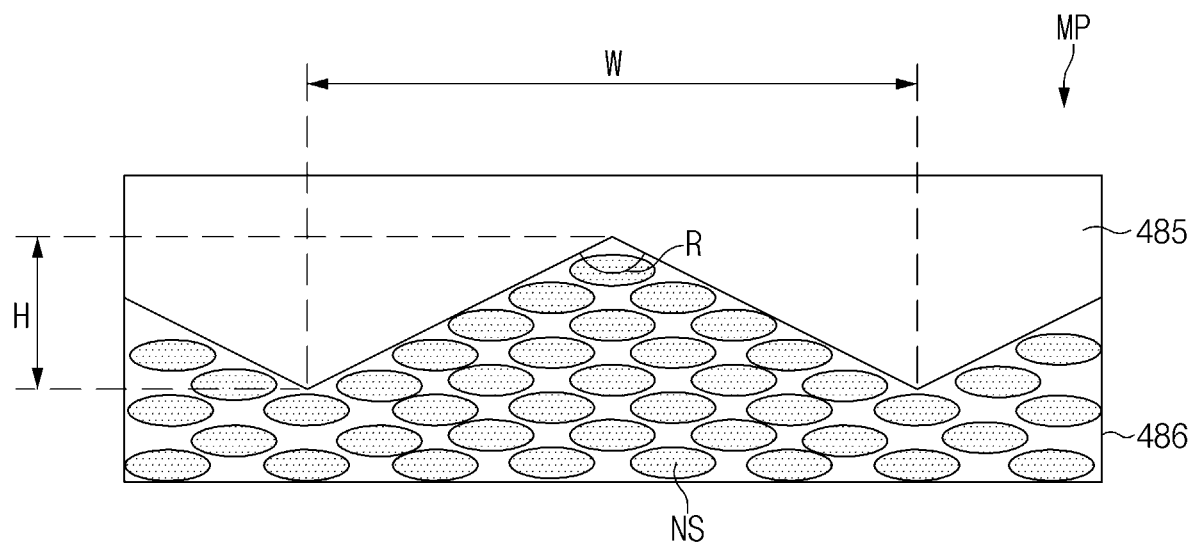
FIG. 4B is a detailed view illustrating one embodiment of a fine pattern of FIG. 4A.

FIG. 4B is a detailed view illustrating one embodiment of the fine pattern of FIG. 4A.

Referring to FIG. 4B, the fine pattern MP may be formed on the UV curable resin layer 485. According to an embodiment, the fine pattern MP may be formed in a shape including ridges and valleys. For example, the valleys of the fine pattern MP may be formed to have a pattern angle R. When the pattern angle R is within a specific range, the back plate 480 may have a sense of depth. When the distance W between the ridges of the fine pattern MP is within a specific range (e.g., 30 μm to 70 μm), the back plate 480 may have a sense of depth. When the distance W between the ridges of the fine pattern MP satisfies the specific range, the luminance of the back plate 480 may be increased as the distance W between the ridges of the fine pattern MP is decreased. When the height H between the ridges and the valleys of the fine pattern MP is within a specific range (e.g., 2 μm to 10 μm), the back plate 480 may have a sense of depth.

According to an embodiment, the metal nanoparticle layer 486 may contain the metal nanoparticles NS. For example, the metal nanoparticles NS may be stacked on the fine pattern MP so as to have a certain orientation. The metal nanoparticles NS may be sequentially stacked in the valleys of the fine pattern MP. The luminance of the back plate 480 may be improved by the orientation of the metal nanoparticles NS and the interference effect and the prism effect of the fine pattern MP.

Figure 4C:
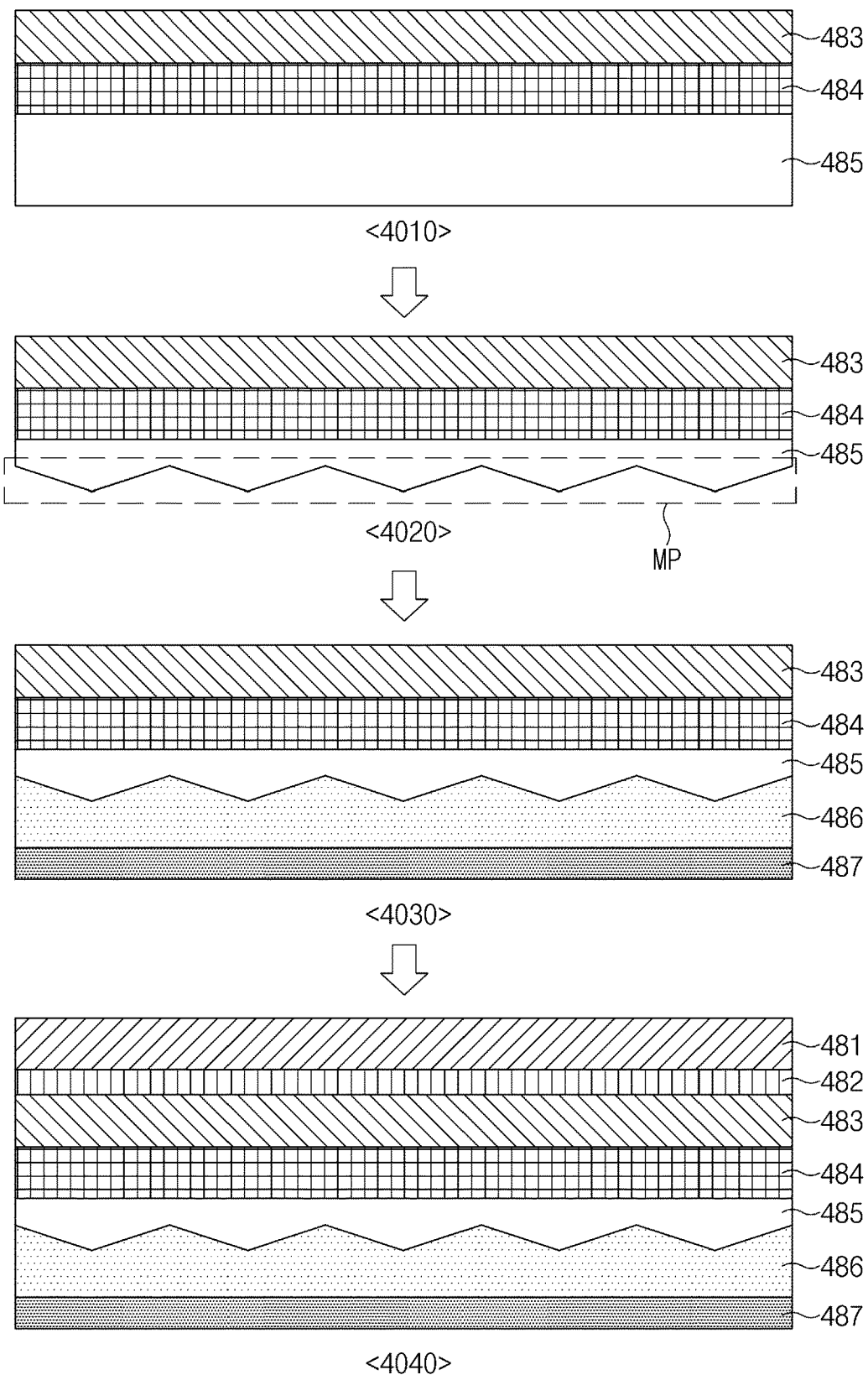
FIG. 4C is a view illustrating a process of forming the back plate of FIG. 4A.

FIG. 4C is a view illustrating a process of forming the back plate of FIG. 4A.

According to an embodiment, in state 4010, the primer layer 484 and the UV curable resin layer 485 may be formed on the polymer compound substrate 483. For example, the primer layer 484 may be printed on the polymer compound substrate 483. The UV molding constituting the UV curable resin layer 485 may be coated on the primer layer 484.

According to an embodiment, in state 4020, the fine pattern MP may be formed on the UV curable resin layer 485. For example, the fine pattern MP may be formed through a pattern transfer process using a mold. The UV molding coated on the primer layer 484 may be compressed by a mold having a shape corresponding to the fine pattern MP, and the fine pattern MP may be formed on the UV molding. When UV rays are applied to the UV molding, the UV molding may be cured in the state in which the fine pattern MP is formed thereon.

According to an embodiment, in state 4030, the metal nanoparticle layer 486 and the printed shielding layer 487 may be printed on the UV curable resin layer 485. For example, a silver paste containing the metal nanoparticles NS may be printed on the fine pattern MP. The metal nanoparticles NS may be printed through a silk screen method. The metal nanoparticles NS may be printed by performing the silk screen method several times in the same direction. The metal nanoparticles NS may be accumulated in the valleys of the fine pattern MP by the silk screen method so as to have a specific orientation. The printed shielding layer 487 may be printed on the metal nanoparticle layer 486. A polymer compound film may be formed by printing the primer layer 484, the UV curable resin layer 485, the metal nanoparticle layer 486, and the printed shielding layer 487 on the polymer compound substrate 483.

According to an embodiment, in state 4040, the formed polymer compound film may be attached to the glass substrate 481. For example, the adhesive layer 482 may be coated on the glass substrate 481. The polymer compound film may be attached to the coated adhesive layer 482.

FIGS. 5 to 8 are views illustrating the forms of UV curable resin layers according to various embodiments.

Figure 5:
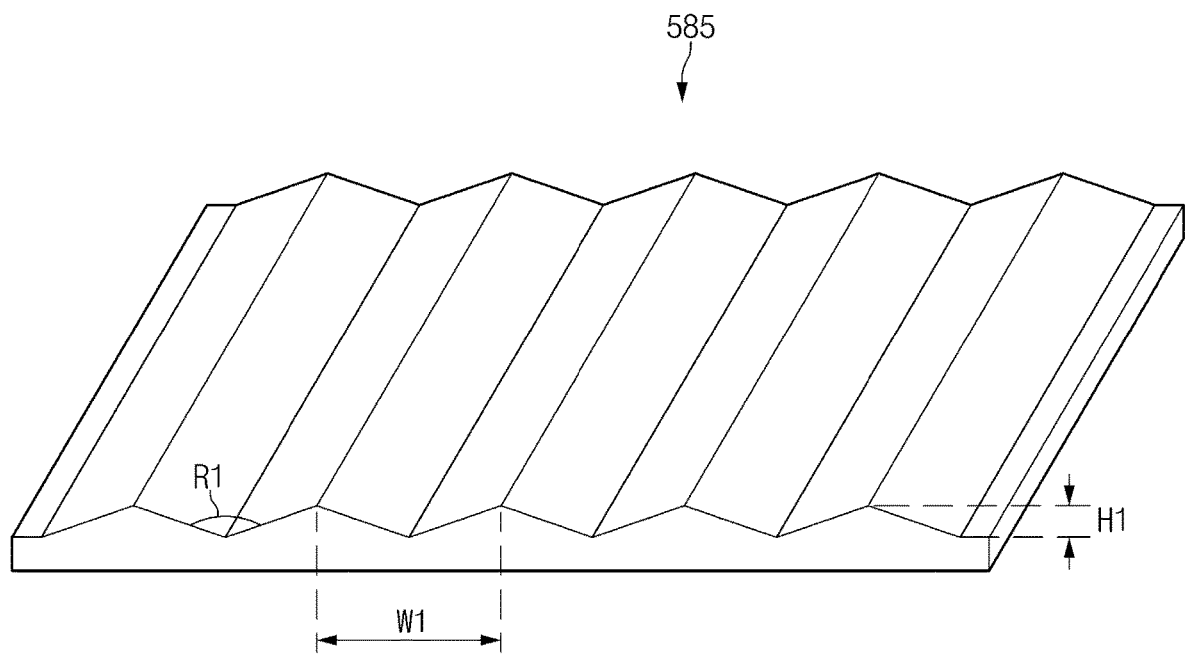
FIG. 5 is a view illustrating one example of the form of a UV curable resin layer.

Referring to FIG. 5, in an embodiment, a UV curable resin layer 585 (e.g., the UV curable resin layer 485) may include a fine pattern (e.g., the fine pattern MP) having a form in which a cross-section having a triangular shape extends in one direction. The fine pattern may include valleys having a first pattern angle R1. The fine pattern may include ridges between the valleys. The form of the fine pattern may be determined by a first pattern distance W1 (e.g., the distance between the ridges) and a first pattern height H1 (e.g., the height between the ridges and the valleys). For example, the first pattern distance W1 may be determined within a specific range (e.g., 30 μm to 70 μm). The first pattern height H1 may be determined within a specific range (e.g., 2 μm to 10 μm).

Figure 6:
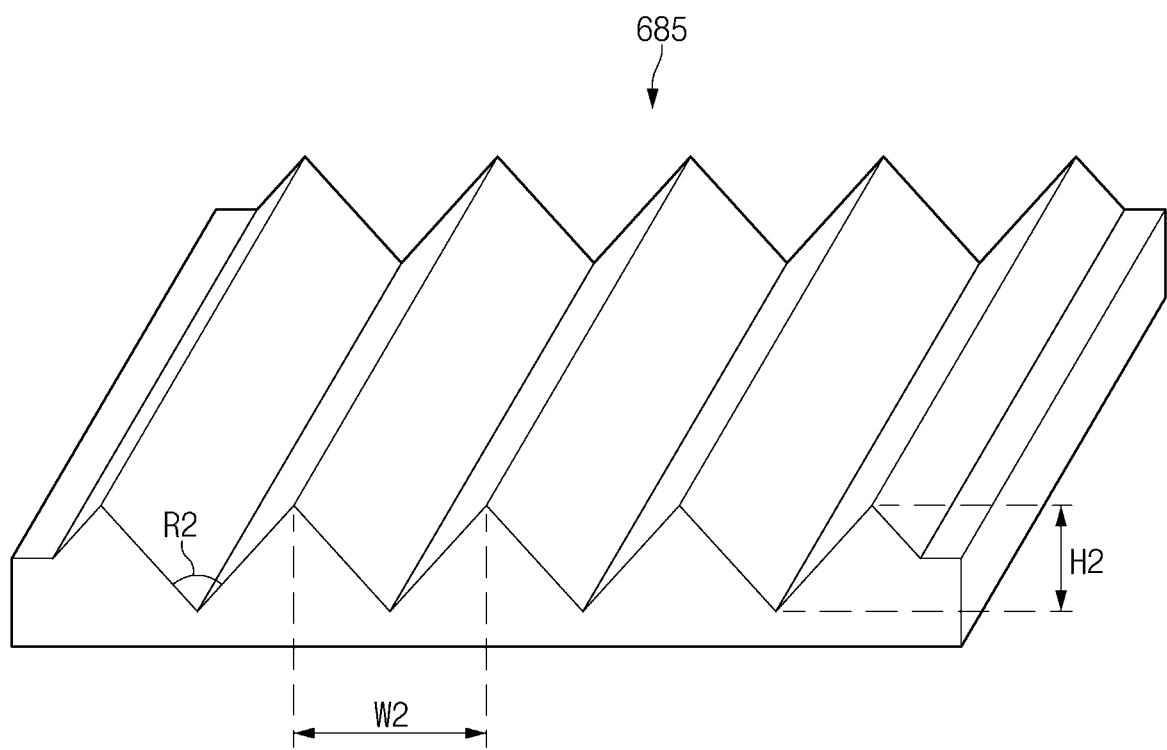
FIG. 6 is a view illustrating another example of the form of the UV curable resin layer.

Referring to FIG. 6, in an embodiment, a UV curable resin layer 685 (e.g., the UV curable resin layer 485) may include a fine pattern (e.g., the fine pattern MP) having a form in which a cross-section having a triangular wave shape extends in one direction. The fine pattern may include valleys having a second pattern angle R2. The fine pattern may include ridges between the valleys. The form of the fine pattern may be determined by a second pattern distance W2 (e.g., the distance between the ridges) and a second pattern height H2 (e.g., the height between the ridges and the valleys). For example, the second pattern distance W2 may be determined within a specific range (e.g., 30 μm to 70 μm). The second pattern height H2 may be determined within a specific range (e.g., 2 μm to 10 μm).

Figure 7:
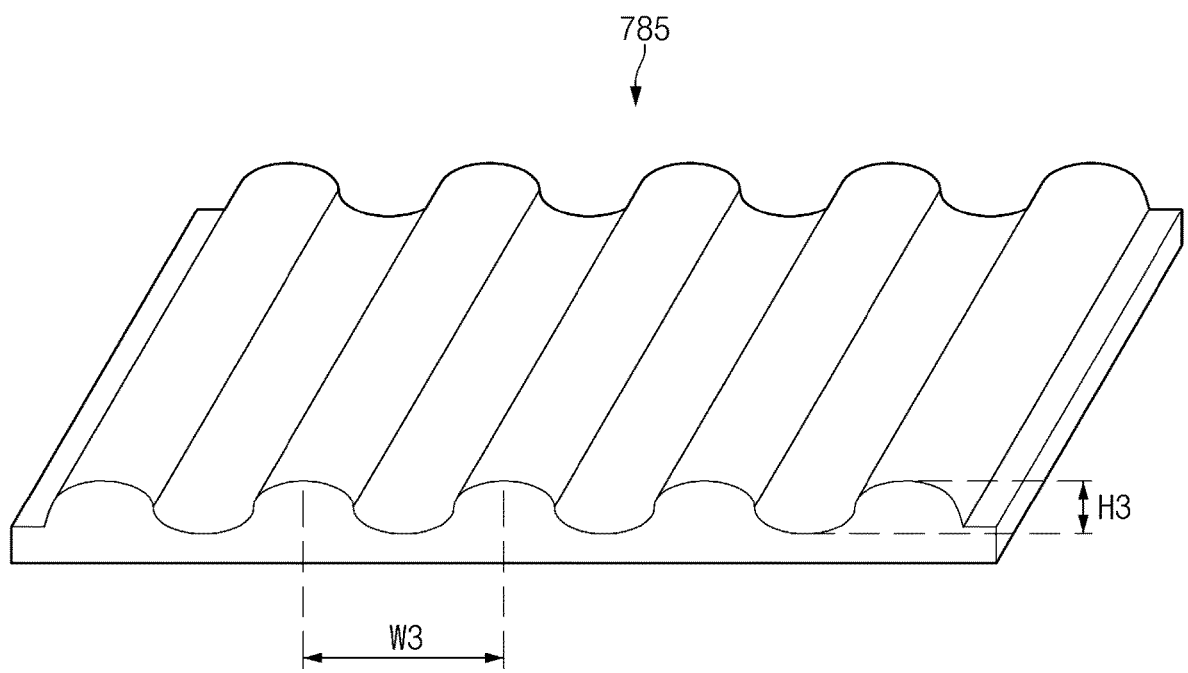
FIG. 7 is a view illustrating another example of the form of the UV curable resin layer.

Referring to FIG. 7, in an embodiment, a UV curable resin layer 785 (e.g., the UV curable resin layer 485) may include a fine pattern (e.g., the fine pattern MP) having a form in which a cross-section having a sinusoidal wave shape extends in one direction. The fine pattern may include valleys and ridges. The form of the fine pattern may be determined by a third pattern distance W3 (e.g., the distance between the ridges) and a third pattern height H3 (e.g., the height between the ridges and the valleys). For example, the third pattern distance W3 may be determined within a specific range (e.g., 30 μm to 70 μm). The third pattern height H3 may be determined within a specific range (e.g., 2 μm to 10 μm).

Figure 8:
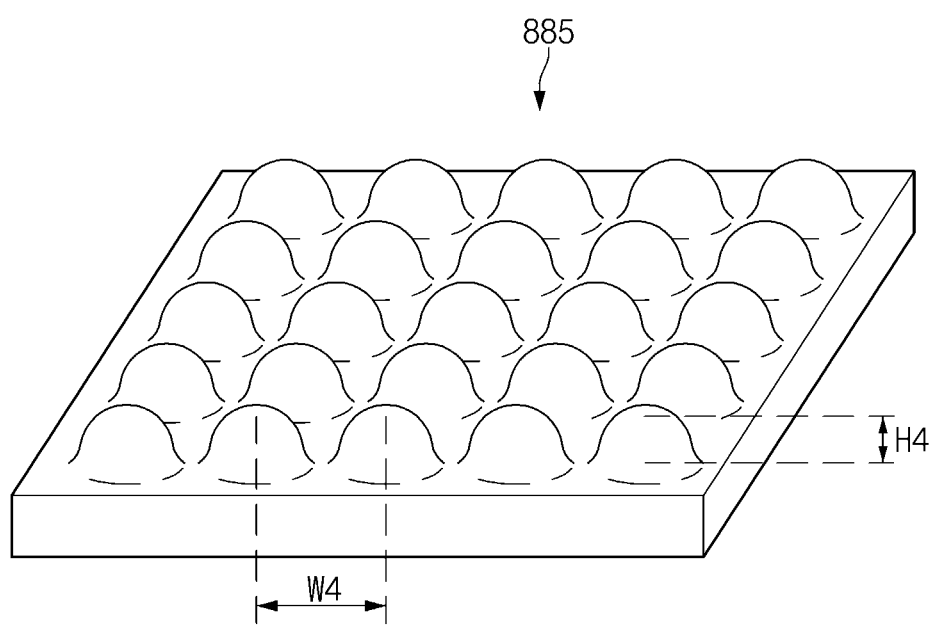
FIG. 8 is a view illustrating another example of the form of the UV curable resin layer.

Referring to FIG. 8, in an embodiment, a UV curable resin layer 885 (e.g., the UV curable resin layer 485) may include a fine pattern (e.g., the fine pattern MP) having a lenticular form. The fine pattern may include valleys and crests. The form of the fine pattern may be determined by a fourth pattern distance W4 (e.g., the distance between adjacent two crests) and a fourth pattern height H4 (e.g., the height between the crests and the valleys). For example, the fourth pattern distance W4 may be determined within a specific range (e.g., 30 μm to 70 μm). The fourth pattern height H4 may be determined within a specific range (e.g., 2 μm to 10 μm).

It should be understood that various embodiments of the disclosure and terms used in the embodiments do not intend to limit technologies disclosed in the disclosure to the particular forms disclosed herein; rather, the disclosure should be construed to cover various modifications, equivalents, and/or alternatives of embodiments of the disclosure. With regard to description of drawings, similar components may be assigned with similar reference numerals. As used herein, singular forms may include plural forms as well unless the context clearly indicates otherwise. In the disclosure disclosed herein, the expressions "A or B", "at least one of A or/and B", "A, B, or C" or "one or more of A, B, or/and C", and the like used herein may include any and all combinations of one or more of the associated listed items.

The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

According to the situation, the expression "adapted to or configured to" used in the disclosure may be interchangeably used with, for example, the expression "suitable for", "having the capacity to", "adapted to", "made to", "capable of", or "designed to" in hardware or software. In some situations, the expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a CPU or an AP) capable of performing corresponding operations by executing one or more software programs stored in a memory device (e.g., the memory 130).

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be mechanically or electronically implemented. For example, the "module" may include an application-specific integrated circuit (ASIC) chip, a field-programmable gate arrays (FPGAs), or a programmable-logic device for performing some operations, which is known or will be developed.

At least a part of an apparatus (e.g., modules or functions thereof) or a method (e.g., operations) according to various embodiments may be implemented by an instruction stored in a computer-readable storage media (e.g., the memory 130) in the form of a program module. When the instruction is executed by a processor (e.g., the processor 120), the processor may perform a function corresponding to the instruction. The computer-readable storage media may include a hard disk, a floppy disk, a magnetic media (e.g., a magnetic tape), an optical media (e.g., a CD-ROM, a DVD, a magneto-optical media (e.g., a floptical disk)), an internal memory, or the like. The instruction may include a code generated by a compiler or a code executable by an interpreter.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the disclosure may be executed sequentially, in parallel, repeatedly, or in a heuristic method. Also, at least some operations may be executed in different sequences, omitted, or other operations may be added.

The invention claimed is:

1. An electronic device comprising:
a first plate configured to form a first surface of the electronic device through which contents are output;
a second plate configured to form a second surface facing away from the first surface; and
a side member configured to surround a space between the first plate and the second plate,
wherein the second plate includes:
a UV curable resin layer including a fine pattern configured to implement an interference effect and a prism effect of light; and
a metal nanoparticle layer printed on the fine pattern so as to have a specific orientation,
wherein the fine pattern is formed in a shape including ridges and valleys,
wherein metal nanoparticles included in the metal nanoparticle layer are disposed in the valley,
wherein a cross section of the metal nanoparticles is shaped as an ellipse with a first length in a long axis direction and a second length in a short axis direction, and
wherein inclined surfaces between the ridges and the valleys of the fine pattern are inclined with respect to the long axis direction and the short axis direction.

2. The electronic device of claim 1, wherein a distance between the ridges of the fine pattern is greater than a height between the ridges and the valleys of the fine pattern.

3. The electronic device of claim 1, wherein a cross-section of the fine pattern has a triangular shape, and the fine pattern has a form in which the cross-section extends in one direction.

4. The electronic device of claim 1, wherein a cross-section of the fine pattern has a triangular wave shape, and the fine pattern has a form in which the cross-section extends in one direction.

5. The electronic device of claim 1, wherein a cross-section of the fine pattern has a sinusoidal wave shape, and the fine pattern has a form in which the cross-section extends in one direction.

6. The electronic device of claim 1, wherein the fine pattern has a lenticular form.

7. The electronic device of claim 1, wherein the second plate includes:
a glass substrate; and
a polymer compound film attached to the glass substrate through a transparent adhesive layer, and
wherein the polymer compound film includes:
a polymer compound substrate; and
a primer layer printed on the polymer compound substrate and configured to implement a color of the second plate.

8. The electronic device of claim 7, wherein the UV curable resin layer is formed by coating UV molding on the primer layer and transferring the fine pattern to the UV molding through a mold.

9. The electronic device of claim 1, wherein the metal nanoparticle layer is formed by printing a silver paste containing the metal nanoparticles on the fine pattern through a silk screen method.

10. The electronic device of claim 9, wherein the metal nanoparticles are printed on the fine pattern by repeatedly performing the silk screen method in a certain direction.

* * * * *